US011830899B1

(12) United States Patent
Lai et al.

(10) Patent No.: US 11,830,899 B1
(45) Date of Patent: Nov. 28, 2023

(54) IMAGE CAPTURE DEVICE AND IMAGE CAPTURE METHOD

(71) Applicant: TRIPLE WIN TECHNOLOGY(SHENZHEN) CO. LTD., Shenzhen (CN)

(72) Inventors: Wen-Ching Lai, New Taipei (TW); Jie Ren, Jincheng (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 18/072,565

(22) Filed: Nov. 30, 2022

(30) Foreign Application Priority Data

Sep. 30, 2022 (CN) .......................... 202211216917.6

(51) Int. Cl.
*H01L 27/146* (2006.01)

(52) U.S. Cl.
CPC .. *H01L 27/14621* (2013.01); *H01L 27/14605* (2013.01); *H01L 27/14627* (2013.01); *H01L 27/14685* (2013.01)

(58) Field of Classification Search
CPC ......... H01L 27/14621; H01L 27/14605; H01L 27/14627; H01L 27/14685
See application file for complete search history.

(56) References Cited

FOREIGN PATENT DOCUMENTS

WO          WO84/01483       *   9/1983   ............... H04N 1/00

* cited by examiner

*Primary Examiner* — Tony Ko
(74) *Attorney, Agent, or Firm* — ScienBiziP, P.C.

(57) ABSTRACT

An image capture device includes a sensing component, a filter layer, and a micromotor. The sensing component includes a plurality of sensing units arranged in an array. The filter layer is disposed on one side of the sensing component and includes a plurality of filter units arranged in an array. The micromotor includes a stator and a mover, the sensing component is fixed on the stator, the filter layer is fixed on the mover. The micromotor is used to drive the filter layer to move relative to the sensing component, such that the plurality of sensing units is moved to a one-to-one corresponding position relative to the plurality of filter units.

18 Claims, 4 Drawing Sheets

IMAGE CAPTURE DEVICE AND IMAGE CAPTURE METHOD

FIELD

The present disclosure relates to the optical field, and in particular, to an image capture device and an image capture method.

BACKGROUND

A filter layer in an existing image capture device can divides a light source into different primary color lights, and then irradiates each primary color light on a sensing component, so as to obtain color information. The primary color lights include a red light, a green light, and a blue light. Specifically, the sensing component includes a plurality of pixel regions, each of the plurality of pixel regions includes a plurality of sensing units, and each of the plurality of sensing units is used to sense a color light, thereby sensing the color information of a pixel region. That is, in a process of capturing an image, the color information of one pixel of the image needs to be recorded by a plurality of sensing units, causing a resolution of the image to be far lower than a resolution of the sensing component.

DETAILED DESCRIPTION

Figure 1:
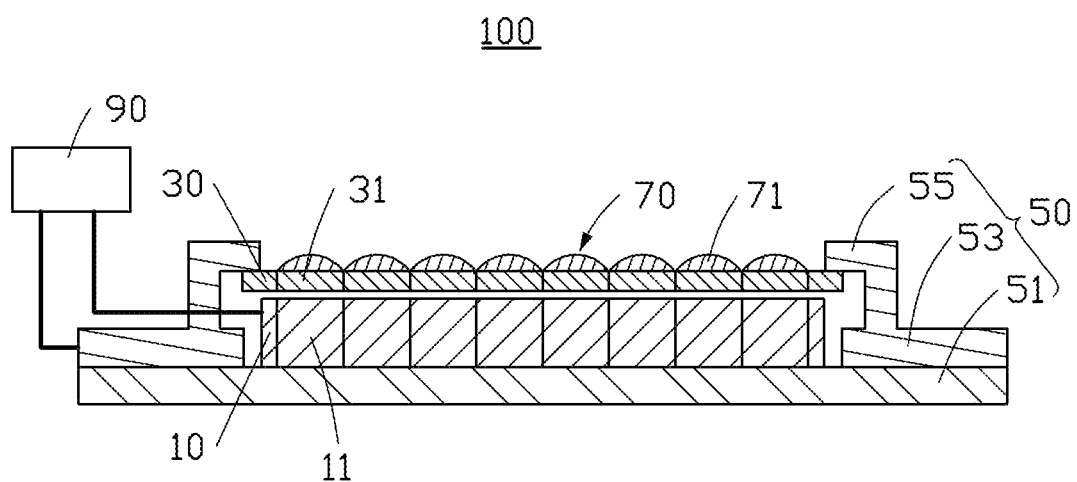
FIG. 1 is a schematic structural diagram of an image capture device according to an embodiment of the present disclosure.

The technical solutions in the embodiments of the present disclosure will be clearly and completely described below with reference to the accompanying drawings in the embodiments of the present disclosure. Obviously, the described embodiments are some of the embodiments of the present disclosure, but not all of the embodiments.

Unless otherwise defined, all technical and scientific terms used in this disclosure have the same meaning as commonly understood by one of ordinary skill in the art to which this disclosure belongs. The terms used in the description of the present disclosure are for the purpose of describing specific embodiments only, and are not intended to limit the present disclosure.

In order to further illustrate the technical means and effects adopted by the present disclosure to achieve a predetermined purpose, the present disclosure will be described in detail below with reference to the accompanying drawings and preferred embodiments.

An embodiment of the present disclosure provides an image capture device. Please refer to FIG. 1, an image capture device 100 includes a sensing component 10, a filter layer 30 and a micromotor 50. The sensing component 10 includes a plurality of sensing units 11 arranged in an array, and each of the plurality of sensing units 11 is used for receiving a light signal and converting the light signal into an electrical signal. The filter layer 30 is disposed on one side of the sensing component 10. The filter layer 30 includes a plurality of filter units 31 arranged in an array for transmitting lights of predetermined wavelength bands to the plurality of sensing units 11. The plurality of filter units 31 includes at least two filter units 31 each of different types, different types of the filter units 31 are used to transmit lights of different wavelength bands (i.e., the at least two filter units each of different types are used to transmit lights of different wavelength bands). The micromotor 50 includes a stator 51 and a mover 53, the sensing component 10 is fixed on the stator 51, the filter layer 30 is fixed on the mover 53, and the micromotor 50 is used to drive the filter layer 30 to move relative to the sensing component 10, such that the plurality of sensing units 11 is moved to a one-to-one corresponding position relative to the plurality of filter units 31 respectively.

In this embodiment, the image capture device 100 can be applied to any electronic device that needs to capture images, such as a camera, a video camera, a monitor, or a mobile phone camera. This disclosure does not limit this.

In this embodiment, the sensing component 10 may be an image sensor such as a charge-coupled device (CCD), and the plurality of sensing units 11 are arranged in an array on the sensing component 10. Each of the plurality of sensing units 11 is used to receive a light signal and generate an electrical signal. When an image light is irradiated on the sensing component 10, each sensing unit 11 receives a part of the image light, and converts the received image light into an electrical signal and record the electrical signal. An arrangement density of the plurality of sensing units 11 determines a resolution of the sensing component 10, that is, the arrangement density of the plurality of sensing units 11 determines a resolution of the image that can be recorded under an illumination of the image light. Because each sensing unit 11 usually only records intensity information of the light signal and cannot record color information of the light signal, as the filter layer 30 of the present disclosure can split the image light into primary color lights, so that each sensing unit 11 only records intensity information of a single color light.

Figure 2:
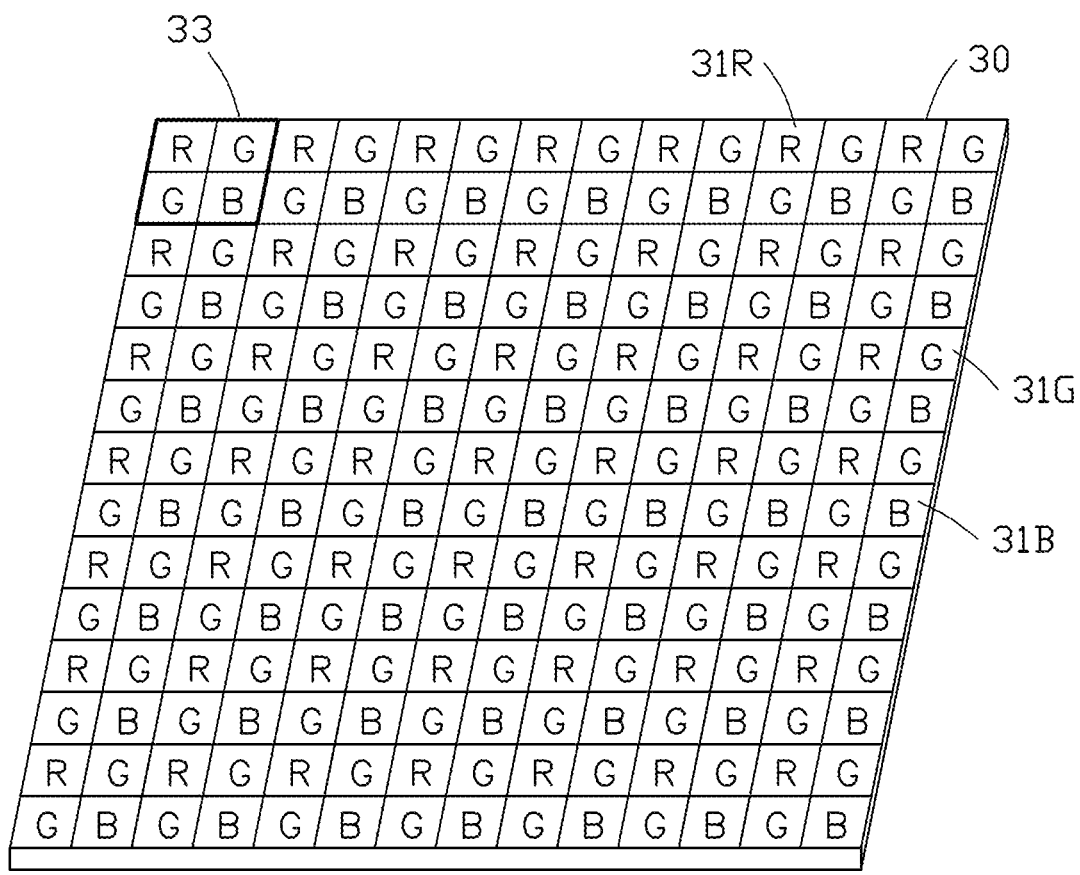
FIG. 2 is a schematic structural diagram of a filter layer according to an embodiment of the present disclosure.

In this embodiment, please refer to FIG. 2, the plurality of filter units 31 on the filter layer 30 are arranged periodically, so that adjacent filter units of the plurality of filter units 31 for transmitting different color lights form a pixel group. Take a pixel group 33 shown in FIG. 2 as an example, a number of filter units 31 in the pixel group 33 that transmits light of one primary color is greater than or equal to one. Specifically, the types of the plurality of filter units 30 in this embodiment includes a first type of filter unit 31R, a second type of filter unit 31G, and a third type of filter unit 31B. As can be seen from FIG. 2, a plurality of pixel groups 33 can be formed.

Take the pixel group 33 as an example, the pixel group 33 includes a filter unit 31R, two filter units 31G, and one filter unit 31B. The filter unit 31R, the filter unit 31G and the filter unit 31B are respectively used for transmitting different color lights. For example, the filter unit 31R is used to transmit the red light, the filter unit 31G is used to transmit the green light, and the filter unit 31B is used to transmit the blue light. In other embodiments, the number of filter units 31 in a pixel group for transmitting one of the primary color lights may be different from the pixel group 33, which is not limited in the present disclosure.

In this embodiment, the pixel group 33 on the filter layer 30 includes four filter units 31, and the four filter units 31 are arranged in an array of two rows by two columns. Specifically, the pixel group 33 includes one filter unit 31R, two filter units 31G and one filter unit 31B. The one filter unit 31R and one of the two filter units 31G are arranged in a first row in sequence, another of the two filter units 31G and the one filter unit 31B are arranged in a second row. The four filter units 31 correspond to four sensing units 11, so that the four sensing units 11 jointly convert the intensity information and color information of the light irradiated on the pixel group 33. In other embodiments, the one filter unit 31R, the two filter units 31G and the one filter unit 31B in the pixel group 33 can also be arranged in other ways, for example, the one filter unit 31R, the two filter units 31G, and the one filter unit 31B each of which is arranged in a row, which are not limited in the present disclosure.

In this embodiment, please continue to refer to FIG. 1, the micromotor 50 includes the stator 51 and the mover 53. The stator 51 is a fixed component for binding the micromotor 50 to other structures such as circuit boards or substrates, and the mover 53 is a movable component for moving relative to the stator 51 after the stator 51 is fixed. For example, the micromotor 50 can be a thin-film linear motor, and the mover 53 can move linearly relative to the stator 51 under the driving of the power supply. During this process, the stator 51 and the mover 53 can be regarded as parallel plate capacitors. Under the action of a bias voltage, a distance between the stator 51 and the mover 53 remains unchanged, and the mover 53 moves parallel to the stator 51. In other embodiments, the micromotor 50 can also be other motors, so that the mover 53 can move relative to the stator 51, which is not limited in the present disclosure.

In this embodiment, the micromotor 50 further includes a bracket 55, which is disposed on the mover 53 and used to fix the filter layer 30 on the mover 53, so that the filter layer 30 can move synchronously with the mover 53. In other embodiments, the filter layer 30 may also be bound on the mover 53 by adhesive, which is not limited in the present disclosure.

In this embodiment, an area of the filter layer 30 is larger than that of the sensing component 10. Specifically, a number of the plurality of filter units 31 on the filter layer 30 is greater than that of the plurality of sensing units 11, so that when the filter layer 30 moves, each sensing unit 11 have a corresponding filter unit 31. In other embodiments, the number of the plurality of filter units 31 may also be the same as the number of the plurality of sensing units 11. In this case, some of the plurality of sensing units 11 may have no corresponding filter unit 31 during a movement of the filter layer 30. In such cases, an overall color of the captured image can be made normal by excluding the electrical signal converted by the sensing unit 11 which has no corresponding filter unit 31, in the process of synthesizing the image.

In this embodiment, the image capture device 100 further includes a micro lens array (i.e., array of micro lenses) 70, the micro lens array 70 is disposed on one side of the filter layer 30 away from the sensing component 10, the micro lens array 70 includes a plurality of micro lenses 71 arranged in an array, each of the plurality of micro lens 71 is disposed corresponding to one filter unit 31 for condensing light. Specifically, the micro lens array 70 is fixed on the filter layer 30, and each micro lens 71 corresponds to one of the plurality of filter units 31. When the image light is irradiated on the image capture device 100, each micro lens 71 can condense the corresponding part of the image light, thereby enhancing the light intensity of the image light, preventing the light from decreasing in intensity after passing through the corresponding filter unit 31 and being difficult to be recognized by the corresponding sensing unit 11.

In this embodiment, the image capture device 100 further includes a controller 90, which is electrically connected to each of the micromotor 50 and the sensing component 10 separately. The controller 90 is used for driving the micromotor 50, so that each sensing unit 11 can be sequentially aligned with each filter unit 31 of each pixel group 33, and record the electrical signal converted when the each sensing unit 11 corresponds to each filter unit 31. Specifically, the controller 90 is used to transmit the electrical signal to the micromotor 50 to control a moving distance and a moving direction of the mover 53 relative to the stator 51, so that each sensing unit 11 can correspond to the plurality of filter units 31.

In this embodiment, the controller 90 is also connected to the sensing component 10 for recording the electrical signal converted by each sensing unit 11, so as to store the image light in a form of electrical signals, and obtain an image signal by combining the electrical signal converted by each sensing unit 11 with a position of the each sensing unit 11 on the sensing component 10. In other embodiments, the sensing component 10 itself can also directly record the electrical signal converted by each sensing unit 11, and directly transmit the image signal to the controller 90, or the controller 90 can also be directly integrated on the each sensing unit 11, this disclosure does not limit this.

In this embodiment, the controller 90 is further configured to synthesize a plurality of electrical signals converted by sensing units 11 into a pixel signal, and synthesize a plurality of pixel signals generated by the plurality of sensing units 11 into an image signal, the image signal include position information corresponding to each of the plurality of pixel signals. Specifically, after each sensing unit 11 converts the light signal transmitted by each filter unit 31 in each pixel group 33 into an electrical signal, a plurality of electrical signals corresponding to different primary color lights can be obtained; By superimposing the plurality of electrical signals, the pixel signal of the part of the image light corresponding to each sensing unit 11 can be obtained; that is, the pixel signal is a signal including color information and light intensity information. The image signal can be obtained by integrating the pixel signals and position information corresponding to the plurality of sensing units 11.

In this embodiment, the controller 90 is configured to acquire and record the color information corresponding to the electrical signal collected by each sensing unit 11 each time according to a position of the filter layer 30 relative to the sensing component 10. Specifically, when the filter layer 30 is not driven by the micromotor, the controller 90 can first record the color of light of each filter unit 31 corresponding to each sensing unit 11, i.e., record an arrangement sequence of the plurality of filter units 31 transmitting different color lights. When the filter layer 30 is driven to move, by recording a moving direction and a moving distance of the filter layer 30, a color light transmitted by each filter unit 31 corresponding to each sensing unit 11 can be determined. In other embodiments, the controller 90 may also be configured to record the color information corresponding to the electrical signal collected by each sensing unit 11 each time according to time. Specifically, when the controller 90 drives the filter layer 30 to move at a predetermined period, the color light transmitted by each filter unit 31 corresponding to each sensing unit 11 also changes according to the predetermined period. By recording an order of a changing of a color light corresponding to each sensing unit 11 and a time of each sensing unit 11 being corresponding to each filter unit 31 in the predetermined period, the color light transmitted by each filter unit 31 corresponding to each sensing unit 11 can be determined. The present disclosure does not limit this, as long as a method capable of recording the color information corresponding to the light signal converted by the sensing unit 11 is within the scope of the present disclosure.

In this embodiment, the area of the filter layer 30 is larger than that of the sensing component 10. Specifically, the number of the plurality of filter units 31 on the filter layer 30 is greater than that of the plurality of sensing units 11, so that when the filter layer 30 moves, each sensing unit 11 always has a corresponding filter unit 31. In other embodiments, the number of the plurality of filter units 31 may also be the same as the number of the plurality of sensing units 11. In this case, some of the plurality of sensing units 11 may have no corresponding filter unit 31 during a movement of the filter layer 30. In some cases, the overall color of the image can be made normal by excluding the electrical signal converted by the sensing unit 11 which has no corresponding filter unit 31, in the process of synthesizing the image.

In the image capture device 100 provided by the embodiment of the present disclosure, by disposing the sensing component 10 and the filter layer 30 on the stator 51 and the mover 53 of the micromotor 50 respectively, the filter layer 30 can be driven to move relative to the sensing component 10, so that any one of the plurality of sensing units 11 on the sensing component 10 can correspond to the plurality of filter units 31 on the filter layer 30, so as to receive the light signals of different color lights contained in the light. By recording the light signals of a same light under different primary color lights for a plurality of times, the color information of the light can be obtained, thereby improving the resolving power of the sensing component 10 and further improving the resolution of the captured image.

Figure 3:
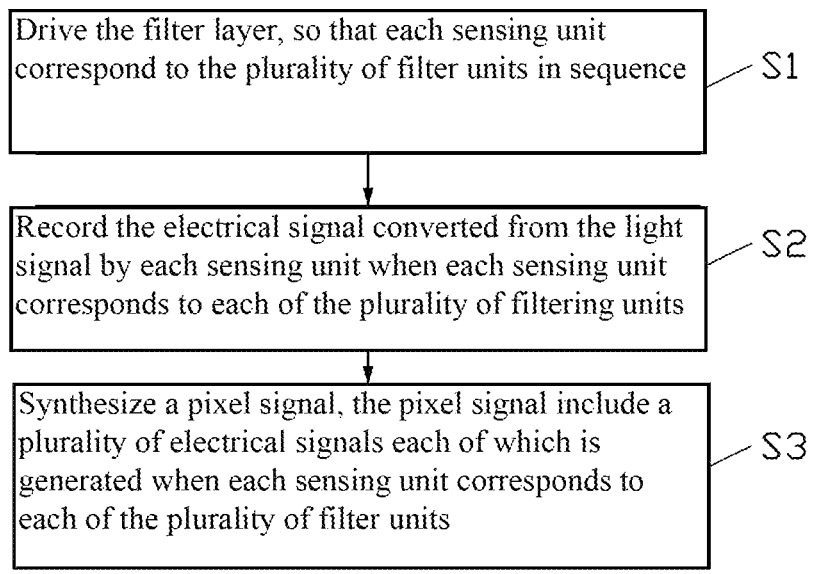
FIG. 3 is a flowchart of an image capture method in an embodiment of the present disclosure.

An embodiment of the present disclosure further provides an image capture method, which is applied to the image capture device 100. Please refer to FIG. 3, the image capture method includes following blocks.

Block S1: the image capture device 10 drives the filter layer, so that each sensing unit correspond to the plurality of filter units in sequence;

Block S2: the image capture device 10 records the electrical signal converted from the light signal by each sensing unit when each sensing unit corresponds to each of the plurality of filtering units;

Block S3: the image capture device 10 synthesizes a pixel signal, the pixel signal including a plurality of electrical signals each of which is generated when each sensing unit corresponds to each of the plurality of filter units.

Figure 4:
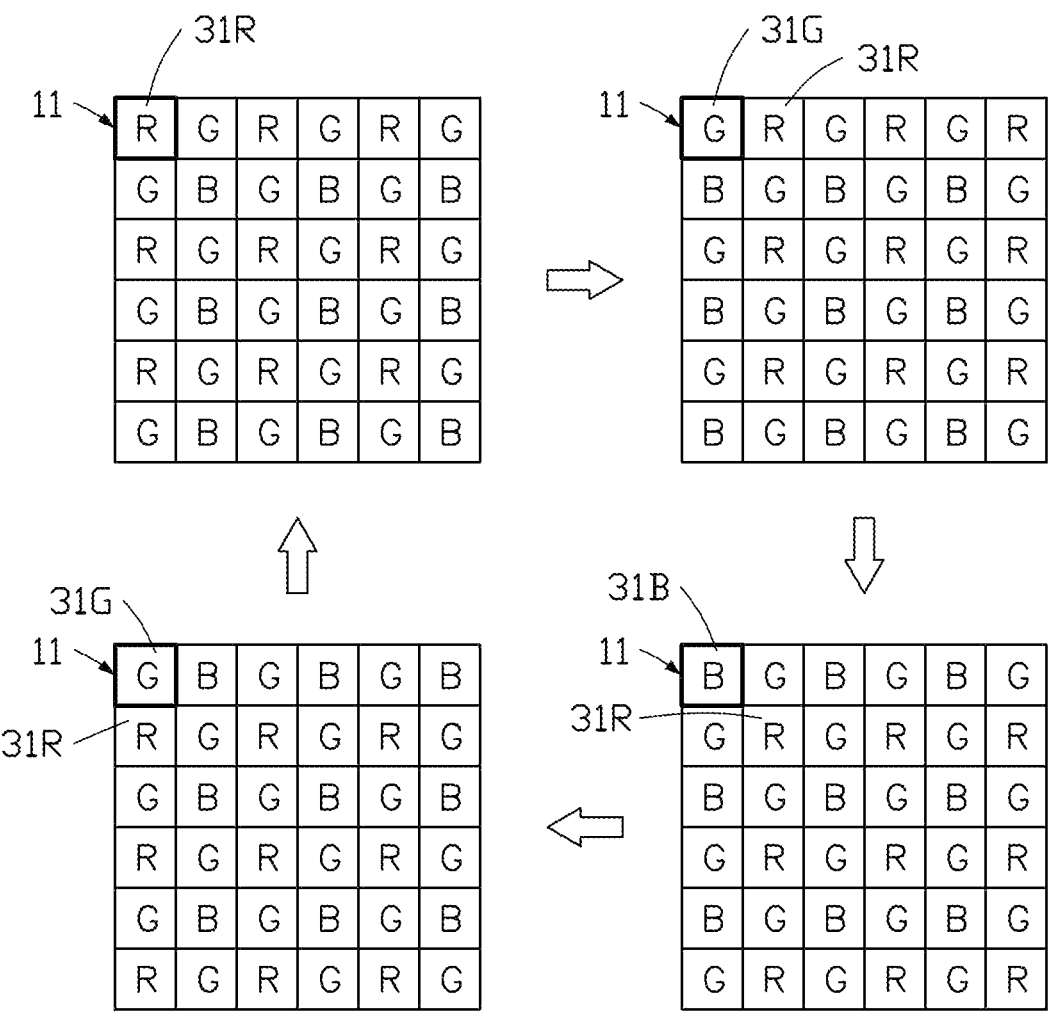
FIG. 4 is a schematic diagram of block S1 of the method in FIG. 3.

In this implementation, please refer to FIG. 2 and FIG. 4 together, block S1 includes: periodically driving the filter layer 30, so that each sensing unit 11 being sequentially corresponding to each of the plurality of filter units in the pixel group 33 one by one. The driving of the filter layer 30 includes driving the filter layer 30 in a direction of a same row or a direction of a same column. The driving of the filter layer 30 includes first driving the filter layer in a direction of a same row, then driving the filter layer in a direction of a same column; or driving the filter layer in the direction of the same column, then driving the filter layer in the direction of the same row. For example, as shown in FIG. 2, the pixel group 33 includes four filter units 31 arranged in two rows and two columns. In an initial state, one of the plurality of sensing units 11 corresponds to the filter unit 31R. After the corresponding light signal is converted into an electrical signal, driving the filter layer 30 in the direction of the same row, so that the one of the plurality of sensing units 11 is aligned with the filter unit 31G, i.e., the one of the plurality of sensing units 11 is corresponding to the filter unit 31G; after converting the corresponding light signal to an electrical signal, driving the filter layer 30 in the direction of the same column, so that the one of the plurality of sensing units 11 is aligned with the filter unit 31B; after converting the corresponding light signal to an electrical signal, driving the filter layer 30 in the direction of the same row, so that the one of the plurality of sensing units 11 is aligned with the filter unit 31G; after converting the corresponding light signal to an electrical signal, the filter layer 30 is driven in the direction of the same column, so that the one of the plurality of sensing units 11 is re-aligned with the filter unit 31R, thereby completing one predetermined cycle. In other embodiments, according to the arrangement of the filter units 31 of different color lights on the filter layer 30, a different method of driving the filter layer 30 can also be set, which is not limited in the present disclosure.

In this embodiment, after one predetermined cycle, the one of the plurality of sensing units 11 collects color information of primary color lights at four corresponding positions, and converting them into electrical signals, that is, color information at each corresponding position is obtained. Compared with the prior art that four sensing units 11 respectively collect color information of primary color lights, the present disclosure uses only one sensing unit 11 can effectively improve the resolution. Specifically, in the prior art, four sensing units 11 are used to capture one pixel of a captured image, and the signals converted by the four sensing units 11 are color signals of an area. The one of plurality of sensing units 11 of the present disclosure can collect the color signal of the area, and the four sensing units 11 each collect the color signal of the corresponding area, so the image light can be further refined, thereby improving the resolution.

In this embodiment, block S3 includes: obtaining a pixel signal corresponding to the one of the plurality of sensing units 11 by synthesizing the converted four electrical signals. Specifically, the pixel signal includes light intensity information when the one of the plurality of sensing units 11 is corresponding to each of the four filter units 31, and including color information of each of the four filter units 31.

In this embodiment, block S3 further includes: adjusting a ratio of the electrical signals according to the light intensity of the light signals. Specifically, since a number of filter units 31 of different color lights in a pixel group 33 is different, a signal of a certain color light may be too strong when synthesizing the pixel signal, which may easily cause the color information of the captured image to be distorted, at this time, by setting a ratio of the electrical signal corresponding to each color light, a degree of color balance can be adjusted, thereby restoring color information of a part of the light corresponding to the sensing unit 11 to the greatest extent.

In this embodiment, the process of performing blocks S1 to S3, further includes: when one of the plurality of sensing units 11 is aligned with each of the plurality of filter units 31, recording the color of the transmitted light each time when the one of the plurality of sensing units 11 is aligned each of the plurality of filter units 31. Specifically, when the filter layer 30 is not being driven to move, the color of each filter unit 31 corresponding to each sensing unit 11 is recorded, i.e., an arrangement sequence of the plurality of filter units 31 transmitting different color lights is recorded. When the filter layer 30 is driven to move, by recording a moving direction and a moving distance of the filter layer 30, a color light transmitted by each filter unit 31 corresponding to each sensing unit 11 can be determined.

In other embodiments, the color information corresponding to the electrical signal collected by each sensing unit 11 each time may also be recorded according to changes in time. Specifically, when the filter layer 30 is moved within the predetermined period, the color light transmitted by each filter unit 31 corresponding to each sensing unit 11 also changes according to the predetermined period. By recording an order of a changing of a color light corresponding to each sensing unit 11 and a time of each sensing unit 11 being corresponding to each filter unit 31 in the predetermined period, the color light transmitted by each filter unit 31 corresponding to each sensing unit 11 can be determined. The present disclosure does not limit a method of recording the color information corresponding to the light signal converted by the sensing unit 11.

In the image capture method provided by the embodiment of the present disclosure, by driving the filter layer 30 and capturing images a number of times, the electrical signals that are converted when a same sensing unit 11 corresponds to the filter units 31 of different color lights can be obtained. By performing synthesis, the color information of the corresponding light can be obtained on one sensing unit 11, thereby improving the resolving power and further improving the resolution of the image.

Those of ordinary skill in the art should realize that the above embodiments are only used to illustrate the present disclosure, not to limit the present disclosure, as long as the above embodiments are properly within the scope of the spirit of the present disclosure variations and variations fall within the scope of the claims of this disclosure.

What is claimed is:

1. An image capture device comprising:
a sensing component comprising a plurality of sensing units arranged in an array, and each of the plurality of sensing units is configured for receiving a light signal and converting the light signal into an electrical signal;
a filter layer disposed on one side of the sensing component, the filter layer comprising a plurality of filter units arranged in an array, the plurality of filter units transmitting light in predetermined wavelength bands to the plurality of sensing units, the plurality of filter units comprising at least two filter units each of different types to transmit light in different wavelength bands; and
a micromotor comprising a stator and a mover, the sensing component being fixed on the stator, and the filter layer being fixed on the mover;
wherein the micromotor drives the filter layer to move relative to the sensing component, so that the plurality of sensing units is moved to a one-to-one corresponding position relative to the plurality of filter units.

2. The image capture device according to claim 1, wherein the plurality of filter units on the filter layer are arranged periodically, so that adjacent filter units of the plurality of filter units form a pixel group, a number of filter units in the pixel group that transmits light of one primary color is greater than or equal to one.

3. The image capture device according to claim 2, further comprising:
a controller, electrically connected to each of the micromotor and the sensing component separately, wherein the controller drives the micromotor so that each of the plurality of sensing units is sequentially aligned with a corresponding one of the plurality of filter units in each of the pixel group, the controller further records the electrical signal converted from the light signal when each of the plurality of sensing units is correspondingly positioned relative to each of the plurality of filter units.

4. The image capture device according to claim 3, wherein the controller is further configured to synthesize the electrical signals into a pixel signal, and synthesize pixel signals into an image signal, the image signal comprising position information corresponding to each of the pixel signals.

5. The image capture device according to claim 3, wherein each pixel group comprises four filter units, and the four filter units are arranged in an array of two rows by two columns, the controller further controls each of the sensing units to periodically align with each of the four filter units.

6. The image capture device according to claim 5 further comprising:
an array of micro lenses disposed on one side of the filter layer away from the sensing component, wherein the array of micro lenses comprises a plurality of micro lenses arranged in an array, each of the plurality of micro lens is disposed to a corresponding one of the plurality of filter units, each of the micro lens condenses light.

7. The image capture device according to claim 1, wherein an area of the filter layer is larger than an area of the sensing component.

8. The image capture device according to claim 7, wherein a number of the plurality of filter units is greater than a number of the plurality of sensing units.

9. The image capture device according to claim 7, wherein a number of the plurality of filter units is equal to a number of the plurality of sensing units.

10. An image capture method comprising:
providing an image capture device comprising a sensing component comprising a plurality of sensing units arranged in an array, and each of the plurality of sensing units is configured for receiving a light signal and converting the light signal into an electrical signal; a filter layer disposed on one side of the sensing component, the filter layer comprising a plurality of filter units arranged in an array, the plurality of filter units transmitting light in predetermined wavelength bands to the plurality of sensing units, the plurality of filter units comprising at least two filter units each of different types to transmit light in different wavelength bands; and a micromotor comprising a stator and a mover, the sensing component being fixed on the stator, and the filter layer being fixed on the mover;
the method comprising:
the micrometer driving the filter layer so that each of the plurality of sensing units is sequentially positioned relative to each of the plurality of filter units;
recording the electrical signal converted by each of the plurality of sensing units when the plurality of sensing units is sequentially positioned to each of the plurality of filtering units; and
synthesizing the electrical signals into a pixel signal.

11. The image capture method according to claim 10, wherein the pixel signal comprises light intensity information, and color information of each of the plurality of filter units.

12. The image capture method according to claim 10, wherein the image capture device is further provided such that the plurality of filter units on the filter layer are arranged periodically, so that adjacent filter units of the plurality of filter units form a pixel group, a number of filter units in the pixel group that transmits light of one primary color is greater than or equal to one.

13. The image capture method according to claim 12, further comprising:
   as the plurality of sensing units is driven to become aligned with the plurality of filter units, recording a color of the transmitted light each time when one of the plurality of sensing units is aligned a corresponding one of the plurality of filter units.

14. The image capture method according to claim 12, further comprising:
   recording a color of light of each one of the plurality of filter units when the filter layer is not driven by the micromotor.

15. The image capture method according to claim 10, wherein the driving of the filter layer comprises:
   periodically driving the filter layer to move relative to the sensing component, so that the plurality of sensing units is moved to a one-to-one corresponding position relative to the plurality of filter units.

16. The image capture method according to claim 15, wherein each pixel group comprises four filter units, and the four filter units are arranged in an array of two rows by two columns.

17. The image capture method according to claim 15, wherein the micrometer further drives the filter layer: in a direction of a same row, and driving the filter layer in a direction of a same column; or
   driving the filter layer in the direction of the same column, and driving the filter layer in the direction of the same row.

18. The image capture method according to claim 15, further comprising:
   adjusting a ratio of the electrical signals according to the light intensity of the light signals.

\* \* \* \* \*